United States Patent [19]
Hong et al.

[11] Patent Number: 5,395,795
[45] Date of Patent: Mar. 7, 1995

[54] METHOD FOR FABRICATING A SEMICONDUCTOR DEVICE

[75] Inventors: Jung-In Hong; Je-Sung Hwang; Min-Suk Han, all of Suwon, Rep. of Korea

[73] Assignee: SamSung Electronics Co., Ltd., Suwon, Rep. of Korea

[21] Appl. No.: 80,053

[22] Filed: Jun. 22, 1993

Related U.S. Application Data

[63] Continuation of Ser. No. 755,863, Sep. 6, 1991, abandoned.

[30] Foreign Application Priority Data

Apr. 9, 1991 [KR] Rep. of Korea ............... 5648/91

[51] Int. Cl.[6] ..................................... H01L 21/441
[52] U.S. Cl. ................................. 437/190; 437/192; 437/194; 437/195
[58] Field of Search ............... 437/190, 192, 194, 195; 148/DIG. 25

[56] References Cited

FOREIGN PATENT DOCUMENTS

| | | | |
|---|---|---|---|
| 138917 | 7/1985 | Japan | 437/194 |
| 142739 | 6/1986 | Japan | 437/192 |
| 174336 | 7/1988 | Japan | 437/190 |
| 133923 | 5/1990 | Japan | 437/192 |
| 271632 | 11/1990 | Japan | 437/190 |

*Primary Examiner*—John S. Maples
*Attorney, Agent, or Firm*—Robert E. Bushnell

[57] ABSTRACT

A process for forming a barrier metal layer and a metal layer on the surface of a contact hole formed on a semiconductor substrate. A titanium and a first titanium nitride layers are sequentially deposited on the surface of the contact hole and annealed, and thereafter, a second titanium nitride layer is deposited on the first titanium nitride layer and annealed, to thereby form a barrier metal layer. A first aluminum layer alloyed with silicon and copper of a given quantity, and a second aluminum layer alloyed with copper of a given quantity, are sequentially deposited on the barrier metal layer, and thereafter performed, the annealing process is performed. A third aluminum layer alloyed with copper of a given quantity is deposited on the second aluminum layer and annealed, to thereby form a metal layer. Accordingly, a leakage current is considerably reduced due to preventions of a silicon extraction phenomenon and an aluminum spike phenomenon, and a contact resistance is reduced and a step coverage is improved by effectively burying the contact hole through the above process, to thereby obtain a reliable semiconductor device.

25 Claims, 2 Drawing Sheets

METHOD FOR FABRICATING A SEMICONDUCTOR DEVICE

This is a file-wrapper-continuation of application Ser. No. 07/755,863, filed on Sep. 6, 1991, now abandoned.

BACKGROUND OF THE INVENTION

The present invention relates to a method for fabricating a semiconductor device, and particularly to a method for forming a barrier metal layer and a metal layer on the surface of a contact hole formed on a semiconductor device.

Conventionally, a known method called "sputtering" is used for depositing metal on the surface of the contact hole formed on the semiconductor substrate so as to form the metal layer. In this case, however, a step coverage around the contact hole becomes worse, resulting in increase of a contact resistance.

A proposed process to solve the foregoing problem is to deposit aluminum on the surface of the contact hole and thereafter anneal the semiconductor device, or deposit aluminum while heating the semiconductor substrate. Accordingly, the contact resistance is reduced by burying the contact hole in the manner of the above process. Silicon component is, however, extracted from the semiconductor substrate and stacked in a lower portion of the contact hole, so that a contact area between the metal layer and a diffusion layer under the contact hole layers is reduced.

To prevent the silicon extraction phenomenon stated above, a distribution layer which is aluminum alloyed with copper of about 0.5% is formed. Accordingly, the silicon extraction phenomenon can be considerably reduced by not supplying silicon component to the aluminum. However, since the silicon component is not included in the aluminum, silicon component contained in the substrate is rapidly melted into the aluminum until the silicon component reaches a critical melting point, forming the void in the portion where the silicon component of the substrate flows out into the aluminum, and the aluminum flows into the void formed in the substrate, thereby causing aluminum spiking at the portion where the silicon component is missing, which increases a leakage current.

SUMMARY OF THE INVENTION

It is therefore an object of the present invention to provide a method for forming a barrier metal layer so as to prevent a reaction of an aluminum layer on a silicon substrate in a semiconductor device.

It is another object of the present invention to provide a method for forming a metal layer so as to maximally prevent a silicon extraction phenomenon and a leakage current in a semiconductor device.

It is a further object of the present invention to provide a method for improving a step coverage and reducing a contact resistance by entirely burying a contact hole in a semiconductor device.

According to an aspect of the present invention, a titanium layer and a first titanium nitride layer are sequentially deposited on the surface of a contact hole formed on a semiconductor substrate and annealed. A second titanium nitride layer is deposited on the first titanium nitride layer and annealed, to thereby form a barrier metal layer. A first aluminum layer alloyed with silicon and copper of a given quantity and a second aluminum layer alloyed with copper of a given quantity, are sequentially deposited on the barrier metal layer, and thereafter, the annealing process is performed. A third aluminum layer alloyed with copper of a given quantity, is deposited on the second aluminum layer and annealed to thereby form a metal layer.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1A:
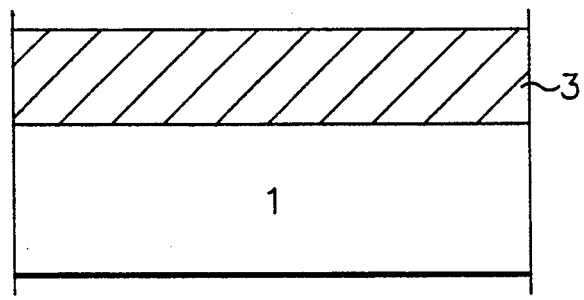
FIGS. 1A to 1G illustrate process for sequentially a barrier metal layer and a metal layer on the surface of a contact hole, according to the present invention.

In FIG. 1A, a boro-phospho-silicate-glass (herein after referred to as BPSG) layer 3 is formed on a silicon substrate 1 as an insulation layer.

Figure 1B:
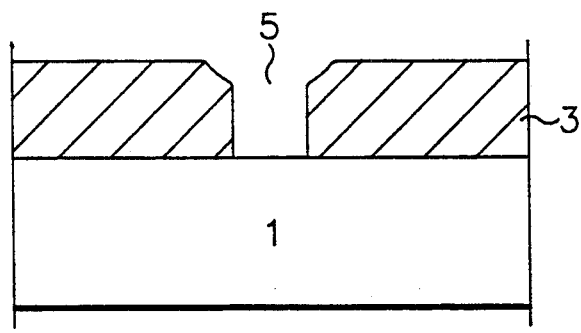

In FIG. 1B, the BPSG layer 3 in the portion where a contact hole 5 is to be formed is etched by photolithography until the surface of the substrate 1 is exposed, to thereby form the contact hole 5.

Figure 1C:
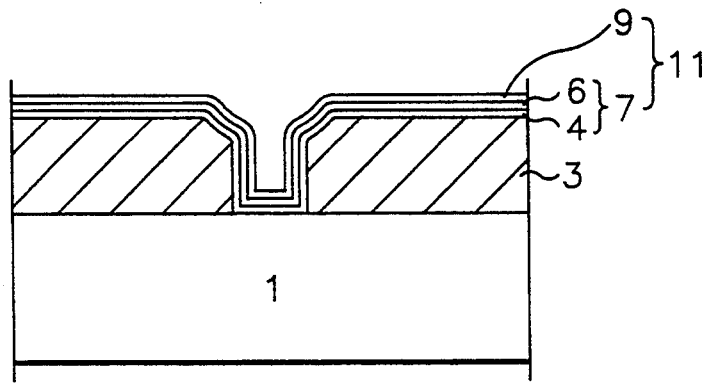

In FIG. 1C a titanium layer 4 of about 300 Å and a first titanium nitride layer 6 of about 900 Å are sequentially deposited on the surface of the contact hole 5 by sputtering method. Then, an annealing process is performed at the temperature of about 450° C. for 30 minutes, to thereby form a lower barrier metal layer 7. Thereafter, a second titanium nitride layer of about 300 Å is deposited on the lower barrier metal layer 7 by sputtering method, to thereby form an upper barrier metal layer 9.

Figure 1D:
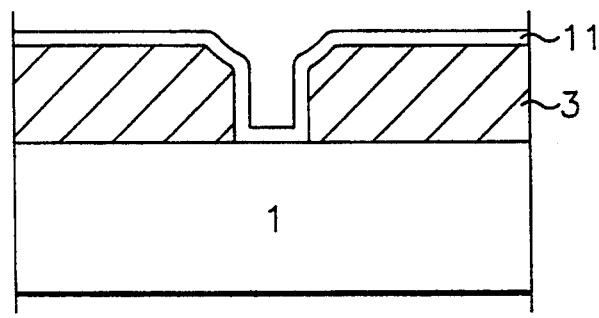

In FIG. 1D, the lower and upper barrier metal layers 7, 9 are annealed of the temperature of about 450° C. for 30 minutes, to thereby form a barrier metal layer 11 as a composition layer.

Figure 1E:
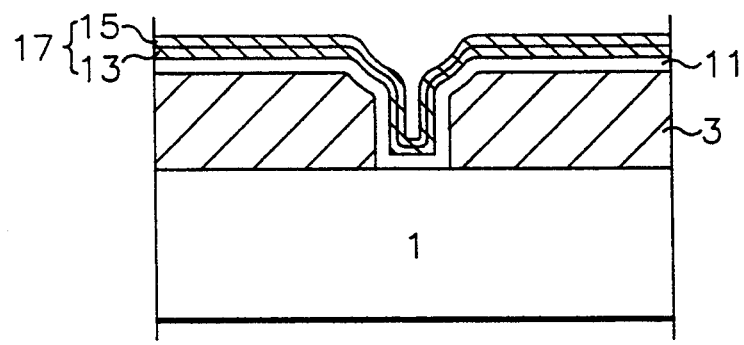

In FIG. 1E, a first aluminum layer 13 of about 2000 Å alloyed with silicon of about 1% and copper of about 0.5%, is deposited on the barrier metal layer 11, and a second aluminum layer 15 of about 2000 Å alloyed copper of about 0.5% is deposited on the first aluminum layer 13.

Figure 1F:
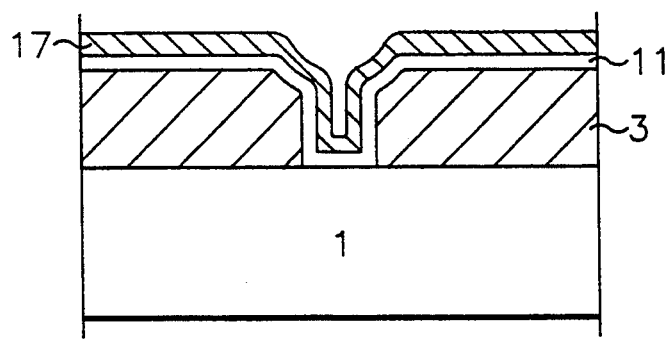

In FIG. 1F, the first and second aluminum layers 13, 15 of about 4000 Å are annealed at the temperature of about 530° C. for 2 minutes, to thereby form an aluminum layer 17.

Figure 1G:
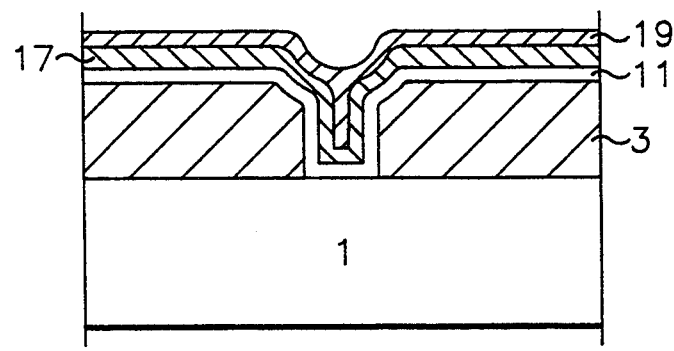

In FIG. 1G, a third aluminum layer 19 of about 2000 Å alloyed with copper of about 5%, is deposited on the aluminum layer 17, and annealed at the temperature of about 530° C. for 2 minutes, to thereby form a metal layer.

As described above, a barrier metal layer is formed by alternatively twice performing depositing and annealing processes in a semiconductor device. As a result, the present invention provides an advantage that a phenomenon of melting silicon into a metal layer and an aluminum spike phenomenon are prevented by suppressing a reaction of the aluminum layer on a silicon substrate. Accordingly, a leakage current is considerably reduced. Furthermore, the first aluminum layer alloyed with copper and silicon, in a silicon alloy ratio in which the silicon of the substrate is not melted into the aluminum layer nor is the silicon stacked in the aluminum layer, and the second aluminum layer alloyed with only copper, are sequentially deposited on the barrier metal layer and thereafter, the annealing process is performed. As a result, the present invention provides another advantage that the silicon extraction phenomenon is prevented and the contact hole is effectively buried. Accordingly, a desirable step coverage is obtained and a contact resistance is reduced. Consequently, the present invention provides a reliable semiconductor device.

While the invention has been particularly shown and described with reference to a preferred embodiment, it will be understood by those skilled in the art that modifications in detail may be made without departing from the spirit and scope of the invention.

What is claimed is:

1. A process for forming a semiconductor device having at least one contact hole formed by etching a portion of a boro-phosphosilicate-glass layer formed on a semiconductor substrate, comprising the steps of:
   forming a barrier metal layer on the surface of said contact hole by sequentially depositing a titanium layer, a first titanium nitride layer and a second titanium nitride layer on the surface of said contact hole;
   depositing first and second aluminum layers sequentially on said barrier metal layer, said first aluminum layer comprising silicon of a given quantity and copper of a first quantity and said second aluminum layer comprising copper of a second quantity; and
   depositing a third aluminum layer comprising copper of a third quantity on said second aluminum layer.

2. A process according to claim 1, further comprised of said titanium layer having a thickness of approximately 300 Å, said first titanium nitride layer having a thickness of approximately 900 Å and said second titanium nitride layer having a thickness of approximately 300 Å.

3. A process according to claim 2, wherein said barrier metal layer is deposited by sputtering.

4. A process according to claim 1 wherein the step for forming said barrier metal layer comprises the steps of:
   depositing said titanium layer having a thickness of 300 Å on the surface of said contact hole;
   depositing said first titanium nitride layer having a thickness of 900 Å on said titanium layer;
   performing a first annealing process; and
   depositing said second titanium nitride layer having a thickness of 300 Å on said first titanium nitride layer, and performing a second annealing process.

5. A process according to claim 4, wherein each of said first and second annealing processes is performed at a temperature of approximately 450° C. for a duration of 30 minutes.

6. A process according to claim 1, wherein said first aluminum layer is an alloy of silicon of about 1% and copper of about 0.5%, and said second and third aluminum layers are respectively alloys of copper of about 0.5%.

7. A process according to claim 6, wherein each of said first, second and third aluminum layers has a thickness of approximately 2000 Å–3000 Å.

8. A process according to claim 1, further comprising the steps of performing third and fourth annealing processes respectively after each of said second and third aluminum layers are deposited.

9. A process according to claim 8, wherein each of said third and fourth annealing processes is performed at a temperature of approximately 530° C. for a duration of 2 minutes.

10. A method for forming a barrier metal layer and a metal layer on the surface of an insulation layer of a semiconductor substrate having at least one contact hole, comprising the steps of:
    forming a lower barrier metal layer on the surface of said insulation layer of said semiconductor substrate and said contact hole by sequentially depositing a titanium layer and a first titanium nitride on the surface of said insulation layer and said contact hole;
    forming an upper barrier metal layer on said lower barrier metal layer by depositing a second titanium nitride layer on said lower barrier metal layer;
    performing a first annealing process on said upper barrier metal layer and said lower barrier metal layer;
    forming a first aluminum alloy layer on said upper barrier metal layer;
    forming a second aluminum alloy layer on said first aluminum alloy layer;
    performing a second annealing process on said first and second aluminum alloy layers;
    forming a third aluminum alloy layer on said second aluminum alloy layer; and
    performing a third annealing process on said third aluminum alloy layer.

11. The method for forming a barrier metal layer and a metal layer according to claim 10, wherein the step for forming said lower barrier metal layer comprises the steps of:
    forming said titanium layer having a thickness of approximately 300 Å on the surface of said semiconductor substrate;
    forming said titanium nitride layer having a thickness of approximately 900 Å on said titanium layer; and
    performing a fourth annealing process on said titanium layer and said titanium nitride layer to form said lower barrier metal layer.

12. The method for forming a barrier metal layer and a metal layer according to claim 11, wherein each of said titanium layer and said titanium nitride layer is deposited by sputtering.

13. The method for forming a barrier metal layer and a metal layer according to claim 10, wherein said second titanium nitride layer has a thickness of approximately 300 Å, and said first annealing process is performed at a temperature of approximately 450° C. for a duration of thirty minutes.

14. The method for forming a barrier metal layer and a metal a layer according to claim 10, wherein said first aluminum alloy layer is comprised of approximately 1% silicon and 0.5% copper, and said second aluminum alloy layer is comprised of approximately 0.5% copper.

15. The method for forming a barrier metal layer and a metal layer according to claim 11, wherein said fourth annealing process is performed at a temperature of approximately 450° C. for a duration of thirty minutes.

16. A method for forming a barrier metal layer and a metal layer on the surface of an insulation layer of a semiconductor substrate having at least one contact hole, comprising the steps of:
    sequentially depositing titanium and titanium nitride on the surface of said insulation layer of said semiconductor substrate and said contact hole to form a first conductive layer;
    performing a first annealing process on said first conductive layer;

depositing titanium nitride on said first conductive layer to form a second conductive layer;

performing a second annealing process on said first and second conductive layers to form said barrier metal layer;

depositing aluminum alloy materials sequentially on said barrier metal layer to form third and fourth conductive layers;

performing a third annealing process on said third and fourth conductive layers;

depositing said aluminum alloy materials on said fourth conductive layer to form a fifth conductive layer; and performing a fourth annealing process on said fifth conductive layer to form said metal layer.

17. The method for forming a barrier metal layer and a metal layer according to claim 16, wherein said first conductive layer is comprised of said titanium a thickness of 300 Å and said titanium nitride with a thickness of 900 Å, and said second conductive layer is comprised of titanium nitride a thickness of 300 Å, and each of said first and second annealing processes is performed at a temperature of approximately 450° C. for a duration of thirty minutes.

18. The method for forming a barrier metal layer and a metal layer according to claim 16, wherein each of said third, fourth and fifth conductive layers has a thickness of approximately 2000 Å to 3000 Å, and said aluminum alloy materials of said third conductive layer comprising approximately 1% silicon and 0.5% copper, and said aluminum alloy materials of said fourth and fifth layers are approximately 0.5% copper.

19. The method for forming a barrier metal layer and a metal layer according to claim 16, wherein each of said third and fourth annealing processes is performed at a temperature of approximately 530° C. for a duration of 2 minutes.

20. The method for forming a barrier metal layer and a metal layer according to claim 16, wherein said insulation layer formed on said semiconductor substrate is a boro-phorphosilicate-glass layer.

21. A method for forming a barrier metal layer on a semiconductor substrate, comprising the steps of:

forming an insulation layer on the surface of said semiconductor substrate;

forming a plurality of contact holes by selectively removing said insulation layer so as to expose the surface of said semiconductor substrate;

successively depositing a titanium layer and a first titanium nitride layer on the surface of said insulation layer and said contact holes;

performing a first annealing process on said titanium layer and said first titanium nitride layer;

depositing a second titanium nitride layer on the surface of said first titanium nitride layer; and performing a second annealing process on said second titanium nitride layer to form a barrier metal layer;

depositing a first aluminum alloy layer on said barrier metal layer;

depositing a second aluminum alloy layer on said first aluminum alloy layer; performing a third annealing process on said first and second aluminum alloy layers;

depositing a third aluminum alloy layer on said second aluminum alloy layer; and performing a fourth annealing process on of said third aluminum alloy layer to form a metal layer on said barrier metal layer.

22. The method for forming a barrier metal layer according to claim 21, wherein each of said titanium layer and said first and second titanium nitride layers is deposited by sputtering, and has a thickness of approximately 300 Å, 900 Å and 300 Å respectively.

23. The method for forming a barrier metal layer according to claim 21, wherein each of said first and second annealing processes is performed at a temperature of approximately 450° C. for a duration of about thirty minutes.

24. The method according to claim 21, wherein said first aluminum alloy layer comprises approximately 1% silicon and 0.5% copper, and each of said second and third aluminum alloy layers comprises approximately 0.5% copper.

25. The method according to claim 21, wherein each of said first, second and third aluminum alloy layers is deposited by sputtering and has a thickness of approximately 2000 Å respectively, and each of said third and fourth annealing processes is performed at a temperature of approximately 530° C. for a duration of about two minutes.

* * * * *